United States Patent [19]
Kadowaki et al.

[11] Patent Number: 5,611,021
[45] Date of Patent: Mar. 11, 1997

[54] MULTIPLE PULSE SERIES GENERATING DEVICE AND METHOD APPLICABLE TO RANDOM PULSE SERIES GENERATING APPARATUS

[75] Inventors: Yukio Kadowaki, Nara; Akemi Nagatani, Amagasaki, both of Japan

[73] Assignee: Ricoh Company, Ltd., Tokyo, Japan

[21] Appl. No.: 430,689

[22] Filed: Apr. 27, 1995

Related U.S. Application Data

[63] Continuation of Ser. No. 17,376, Feb. 12, 1993, abandoned.

[30] Foreign Application Priority Data

Feb. 14, 1992 [JP] Japan .................................. 4-027908

[51] Int. Cl.[6] ................................................ G06F 15/18
[52] U.S. Cl. ................................ 395/27; 395/21; 395/24; 340/870.19
[58] Field of Search ................... 340/870.19; 375/360; 395/202.5, 27, 2, 2.1, 2.28; 382/12–15; 348/524; 365/233

[56] References Cited

U.S. PATENT DOCUMENTS

| | | | |
|---|---|---|---|
| 3,935,387 | 1/1976 | Kaptein | 348/524 |
| 4,189,784 | 2/1980 | Mendenhall | 365/233 |
| 4,893,255 | 1/1990 | Tomlinson, Jr. | 395/24 |
| 5,259,064 | 11/1993 | Furuta et al. | 395/22 |
| 5,276,712 | 1/1994 | Pearson | 375/60 |
| 5,434,564 | 7/1995 | Nakanuma | 340/870.19 |

OTHER PUBLICATIONS

"Functions of Linear Feedback Shift Registers" in the publication Nikkei Electronics, Jun. 6th, 1983, pp. 126 and 127, published by Nikkei BP company.

"Feedback Shift Registers For Self–Testing Circuits" in the publication VSLI Systems Design, Dec. 1986, pp. 50, 51, 54, 55, 56 and 58, published by CMP Publications, Inc.

*Primary Examiner*—Tariq R. Hafiz
*Attorney, Agent, or Firm*—Woodcock Washburn Kurtz Mackiewicz & Norris

[57] ABSTRACT

A linear feedback shift register comprises a plurality of flip-flop devices, wherein the linear shift register is constituted so as to provide a plurality of pseudo-random pulse series in parallel. A data providing device performs a calculation on the plurality of pseudo-random pulse series so as to provide a plurality of output pulse series in parallel, wherein each of the plurality of output pulse series has the pulse generating probability different from the pulse generating probability of each of the other pulse series of the plurality of output pulse series.

2 Claims, 13 Drawing Sheets

47 PRIMARY RANDOM PULSE SERIES GENERATING UNIT

140 PRIMARY RANDOM PULSE SERIES GENERATING UNIT

MULTIPLE PULSE SERIES GENERATING DEVICE AND METHOD APPLICABLE TO RANDOM PULSE SERIES GENERATING APPARATUS

This is a continuation of U.S. patent application Ser. No. 08/017,376, filed Feb. 12, 1993 now abandoned.

BACKGROUND OF THE INVENTION

The present invention relates to a multiple pulse series generating device and method which can be applied to a primary random pulse series generating unit, and particularly relating to a multiple pulse series generating device and method which can be applied to a primary random pulse series generating unit which can be used in a random pulse series generating apparatus that can be used in a signal processing circuit network such as, for example, a neural network computer imitating a neural network.

There is a case where a so-called approximate calculating is performed in which approximate data is used, which approximate data is approximate to data that is actually produced, but which approximate data is not the exact data that is actually produced. In this case, generating of a random number is necessary to produce the above approximate data. A random pulse series generating device in a first related art which is used for generating a pseudo-random pulse series is, as shown in FIG. 1, comprised of: a pseudo-random-number generator 1; a register 2 for storing a plurality of pulse series density values; and addition/subtraction unit (ALU) 3 for examining differences between these pulse series density values. In an application of such a random pulse series generating device, many pseudo-random pulse series are needed in one system. Therefore the circuit scale of the addition/subtraction unit (ALU) has to be correspondingly large, and thus the circuit construction becomes very large. Thus, it becomes difficult to constitute a system of the random pulse series generating device by using one LSI. One such system to which the device is applied, which system needs many pseudo-random pulse series, is a neural network system. The random pulse series generating apparatus in the first related art and a second related art will now be described which description will be limited to describing the application of the device to a neural network system.

The "pulse series" is obtained as a result of a pulse density modulation being performed on a signal or on a numerical value, both the signal and value having certain magnitudes respectively, and thus such a pulse series expresses a certain magnitude of a numeral. Further, the term "pulse density" means a value obtained as a result of counting how many pulses are "1" from among pulses present in a frame, the term "frame" meaning a part of the pulse series obtained as a result of dividing the pulse series into the partial pulse series present in unit times respectively. In an example of the pulse density, in a case where the frame is "100", the corresponding pulse density is determined as a result of counting how many pulses are "1" when a hundred pulses are input. Further, the term "random pulse series" means a pulse series in which the pulses of "1" are generated randomly. Further, the term "pseudo-random pulse series" means a pulse series approximate to the random pulse series.

The neural network system will now be described briefly. A basic unit of information processing in a living body is a neuron. Functions of neurons are imitated, and "neuron imitation elements" resulting from this imitation to form a network. This resulting network is the so-called neural network. This neural network is made for the purpose of enabling a parallel processing of information.

Basic operations executed in the neural network system will now be described with reference to FIG. 2. In an example of the operations, input signals x1 through x5 are multiplied by corresponding weights W1 through W5 respectively, the multiplication results are then added together, and a non-linear process is then performed on this addition result, as shown in the following equation (1):

$$y = f\left( \sum_{i=1}^{5} xi \cdot Wi \right) \qquad (1)$$

Further, a function for executing the non-linear process is called a "sigmoid function", which function is expressed by the following equation (2):

$$f(x) = 1/(1+e^{-x}) \qquad (2)$$

There is a method for executing the above multiplication and addition calculations shown in the equation (1), and in this method, multipliers and adders are used. Normally, in the above neural network system, more than a thousand neurons are used, and from several tens to up to several hundreds of input signals are supplied to each neuron. Thus, the number of the above multiplication and addition calculations that has to be performed becomes huge in the entire neural network system. Therefore, it becomes difficult to realize a neural network system made of corresponding hardware.

There is a method for reducing the scale of hardware corresponding to the neural network system. In this method, the calculation result is not obtained as a result of using respective values of the input signals xi and the weight factors wi themselves as they are. Instead, in the method the above input signals and weight factors are indicated by the corresponding pulse densities, the multiplication calculations of the input signals and weight factors are replaced by corresponding logical multiplication calculations respectively, and the addition calculation of these multiplication calculations are replaced by corresponding logical addition result respectively. This method can be realized by a circuit shown in FIG. 3.

That is, in an example of the above method, the input signal x1 and the weight factor W1 are supplied to a logical multiplication device 31, both the input signal x1 and the weight factor W1 comprising the pulse series respectively, and these pulse series corresponding to the respective input signal x1 and the weight factor W1. Similarly, the input signals x2 through x5 and the weight factors W2 through W5 are supplied to other logical multiplication devices 32 through 35 respectively. Outputs of these logical multiplication devices 31 through 35 are supplied to a logical addition unit 36, and output data provided from the logical addition device 36 is output of the neuron corresponding to the devices of FIG. 3.

In the above replacement of the arithmetic multiplication calculation of the equation (1) into the corresponding logical multiplication calculation, in the case where the input signals and the weight factors are expressed by the corresponding pulse densities, the more random the corresponding pulses generated, the nearer the result of the logical multiplication is to the result of the arithmetic multiplication. Thus, and such a random pulse series generating device as the above random pulse series generating device 4 of FIG.1 has to be used for a generating apparatus for obtaining these pseudo-random pulse series.

In such a system as the neural network system that needs a great number of pseudo-random pulse series, a great number of above random pulse series generating devices 4 are needed accordingly. However, the ALU 3 constituting a part of each of these generating apparatuses 4 has to have a large scale equivalent to the large scale of the corresponding circuit. Thus, the entire system for generating the great number of pseudo-random pulse series has a huge scale equivalent to the corresponding circuit construction, and constructing the entire system by using one LSI is difficult. This is a problem.

For the purpose of solving this problem, the present applicant has proposed a random pulse series generating apparatus 48, in the second related art, shown in FIG. 4. This random pulse series generating apparatus 48 will be now described with reference to FIG. 4.

An up/down counter 46 is capable of being pre-loaded or a shift input, the up/down counter being of a four-bit type. ("Capable of being pre-loaded or shift input" means that one of two methods, a pre-loading method or a shift input method, can be selected for inputting data to the up/down counter. In the pre-loading method, all data is input at once synchronously with a clock signal, and in the shift input method, data is input to the counter in series synchronously with a clock signal.) Input data D0 through D3, the data being used for presetting the up/down counter 46, are supplied to the up/down counter 46. These input data D0 through D3 are latched by the up/down counter 46, when a clock signal provided to the up/down counter 46 rises, in a case where a control signal LOAD provided to the up/down counter 46 is "1".

The above input data D0 through D3 respectively correspond to the above weight factors which are to be stored in the register 2 of FIG. 1, and the data D0 through D3 weigh the pseudo-random pulse series, as output data, output from an OR device 44 constituting a part of the random pulse series generating apparatus 48. That is, the data D0 through D3 are data for determining the pulse density of the pseudo-random pulse series. (Hereinafter, data stored in the up/down counter 46 will be referred to as random pulse density determination data.) In the apparatus 48, a part for storing the random pulse density determination data is not comprised, for example, of a RAM (read only memory), but is instead comprised of a counter such as the up/down counter 46. This creates an advantage, namely, re-writing of the stored data is facilitated.

Each of AND devices 40 through 43 has first and second input terminals, output terminals A0 through A3 of the up/down counter 46 being connected to the first input terminals of these AND devices 40 through 43 respectively. A primary random pulse series generating unit 47 generates the pseudo-random pulse series, outputs of this primary random pulse series generating unit 47 being connected to the second input terminals of the AND devices 40 through 43, respectively.

Further, output terminals of the above AND devices 40 through 43 are connected to four input terminals of an OR device 44, respectively, which OR device 44 provides the pseudo-random pulse series.

The above primary random pulse series generating unit 47 is comprised of four sets of random pulse series generating devices as shown in FIG. 5, each of the random pulse series generating devices of FIG. 5 having the same constitution as that of the random pulse series generating device 4 shown in FIG. 1. Respective registers 2-0 through 2-3 store the respective weight factors, the respective weight factors corresponding to respective primary random pulse series w0 through w3 which are provided from the respective ALUs 3. Thus, similarly to the above first related art, the pulse densities of the above primary random pulse series w0 through w3 may vary as a result of varying the stored data stored in the above registers 2-0 through 2-3 respectively.

Operations of the random pulse series generating apparatus 48 having the above composition will be now described.

This random pulse series generating apparatus 48 operates in a manner basically, similar to the operations described with reference to FIG. 4. That is, the up/down counter 46 provides, to the respective AND devices 40 through 43 in parallel, respective bit data of the random pulse density determination data, synchronous with the clock signal provided from the outside. The primary random pulse series w0 through w3 provided from the primary random pulse series generating unit 47 are provided to the AND devices 40 through 43 respectively, also synchronous with the above clock signal.

The AND devices 40 through 43 perform the logical-multiplication calculations on both the above data provided, synchronously with the above clock signal, respectively, and results of the logical-multiplication calculations are then provided to the OR device 44.

The OR device 44 performs the logical-addition calculations on the above logical-multiplied data provided from the AND devices 40 through 43 synchronous with the above clock signal, and the OR device 44 thus provides the output as one of the pseudo-random pulse series. Concrete examples of the respective output data will be described at appropriate later parts of this specification.

An advantage of the random pulse series generating apparatus of the second related art having the above mentioned composition of the apparatus 48 will now be described. That is, in an example of an application of random pulse series generating apparatuses, there may be a case where a hundred the pseudo-random pulse series are needed. In this case, in the above first related art, a hundred sets of the random pulse series generating devices, each generating device having the constitution shown in FIG. 1, are needed accordingly. That is, a hundred sets of the ALUs 3, each of which has a large circuit scale, are needed.

On the other hand, in a case where the random pulse series generating apparatus of the second related art, that has been proposed by the present applicant, is applied to the above example, the following constitution is needed for the random pulse series generating apparatus in the second related art for a hundred pseudo-random pulse series. A hundred sets, each set comprising the up/down counter 46 the AND devices 40 through 43 and the OR device 44, are provided, and the AND devices 40 through 43 of each set of the above hundred sets are provided with the primary random pulse series w0 through w3 provided from the primary random pulse series generating unit 47 commonly, in the random pulse series generating apparatus in the second related art for a hundred pseudo-random pulse series. Thus, the above advantage of the second related art is that it does not matter whether or not the primary random pulse generating unit 47 is provided in the random pulse series generating apparatus that has the above one hundred sets of parts 46, 40 through 43 and 44, as the random pulse series generating apparatus only has to have the four-bit constitution as in the above-mentioned example of FIG. 4. The above advantage means that the random pulse series generating apparatus in the second related art for a hundred pseudo-random pulse series has to have only the four sets of the above ALUs (each having the large circuit scale as mentioned above) that are to be provided in the primary random pulse series generating unit 47. A circuit scale of each of the hundred sets each comprising the up/down counter 46, AND devices 40 through 43, and the OR device 44 may be less than half the circuit scale of one set of the ALU. Thus, the random pulse series generating apparatus in the second related art for hundred pseudo-random pulse series has a circuit scale greatly reduced in size in comparison to the corresponding apparatus in the above first related art.

However, in the random pulse series generating apparatus 48 of the second related art, the primary random pulse series generating unit 47 has to have the plurality of the ALUs 3 as shown in FIG. 5. Thus, the circuit scale of the primary random pulse series generating unit 47 can become large depending on the number of the ALUs to be provided therein. This is a problem. For the purpose of solving this problem, preferably, the primary random pulse series generating unit 47 is provided separate from the random pulse series generating apparatus 48 or separate from the above random pulse series generating apparatus in the second related art for a hundred pseudo-random pulse series.

SUMMARY OF THE INVENTION

The present invention is effective for solving such a problem as mentioned above. A multiple pulse series generating device according to the present invention provides a plurality of output pulse series. The plurality of output pulse series is used as primary random pulse series, each primary random pulse series has a corresponding desired predetermined pulse-series densities, and the circuit scale of the multiple pulse series generating device used as a primary random pulse series generating unit can be reduced.

The primary random pulse generating unit according to the present invention comprises:

a linear feedback shift register comprising a plurality of flip-flop means and at least one exclusive OR device. Each flip-flop means of the plurality of flip-flop means flipping output thereof in response to a first input provided thereto, and this flip-flop means flopping the output thereof in response to a second input provided thereto. The above means are connected as follows. The plurality of flip-flop means are connected to each other in series so as to form a loop, respective outputs of two flip-flop means of the plurality of flip-flop means are provided to the exclusive OR means, and output of the exclusive OR means is provided to one flip-flop means of the plurality of flip-flop means and the other exclusive OR means. The above connections are to be done so that the linear feedback shift register can act as a pseudo-random pulse series generator.

n flip-flop means from among the plurality of flip-flop means are numbered from first to nth in arbitrary order. Output of first flip-flop means of the plurality of flip-flop means is to be first pulse series of the plurality of output pulse series. The following process is carried out for each ith flip-flop means (where $1<i\leq n$). A logical-multiplication calculation is performed on an output of the ith flip-flop means of the plurality of flip-flop means and respective results of inverting respective outputs of the first through $(i-1)$th flip-flop means of the plurality of flip-flop means respectively. The result of the above multiplication calculation is an ith pulse series of the plurality of output pulse series.

In the above constitution, because the pseudo-random pulse series is generated by the plurality of the flip-flop means, a circuit scale of the random pulse series generating apparatus comprised of the primary random pulse series generating unit according to the present invention can be reduced in comparison to that of the above first and second related arts which each have to be comprised of the ALU having a large circuit scale.

Other objects and further features of the present invention will become more apparent from the following detailed description when read in conjunction with the accompanying drawings.

DESCRIPTION OF THE PREFERRED EMBODIMENTS

Figure 1:
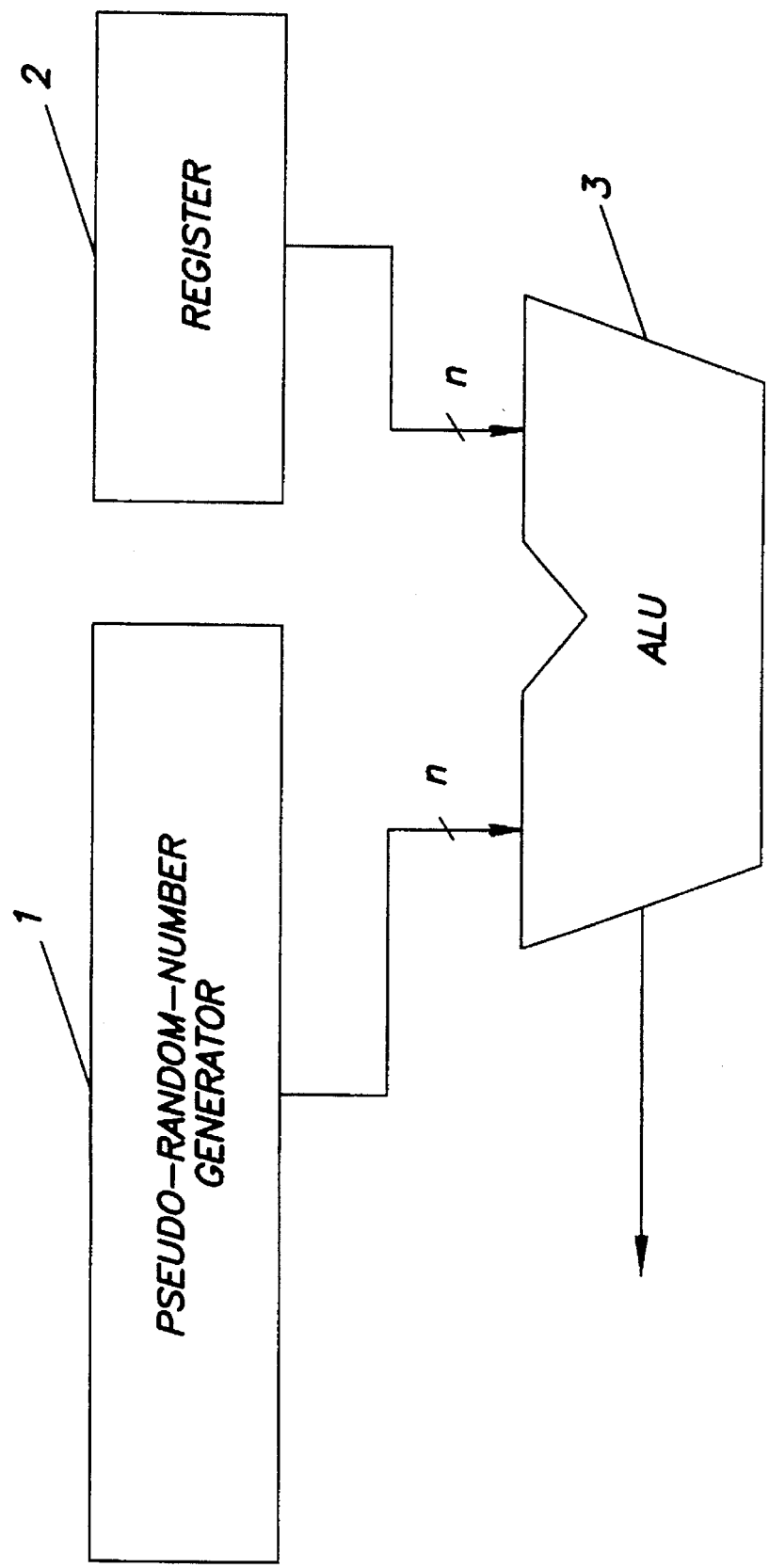
FIG. 1 shows a block diagram of a random pulse series generating device of a first related art.
Figure 2:
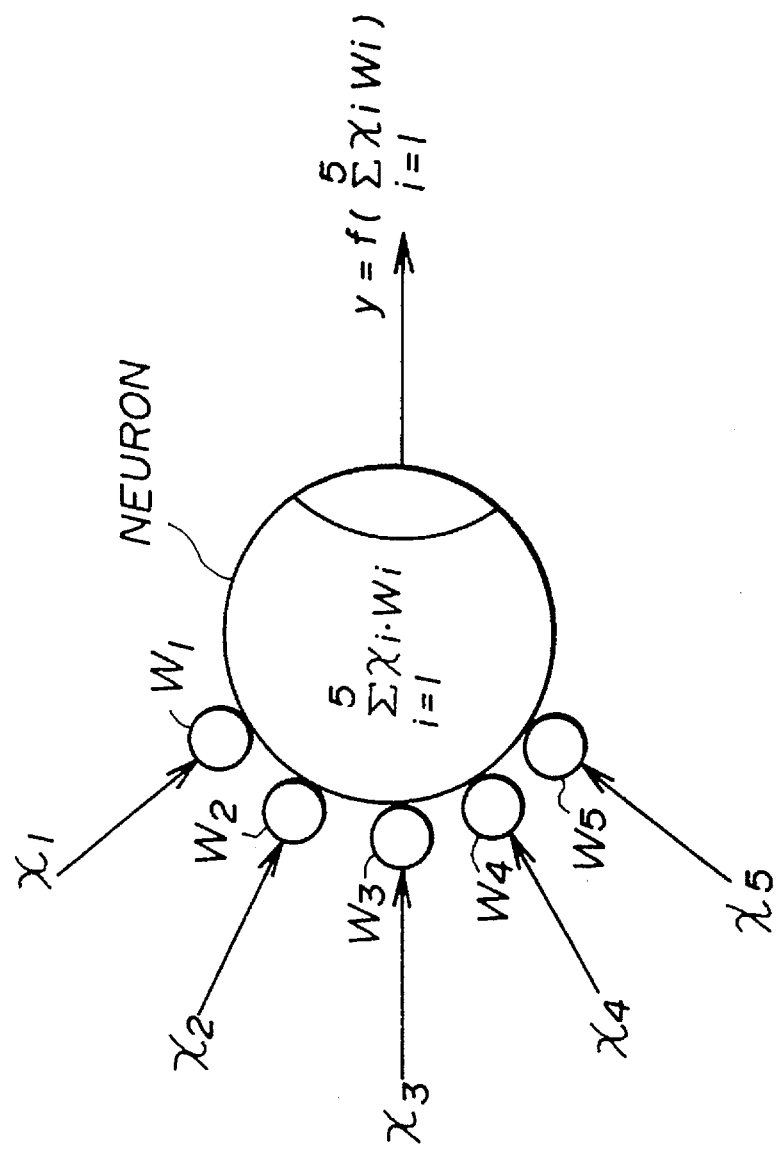
FIG. 2 illustrates a calculating operation of a neuron constituting a part of a neural network system.

A primary random pulse series generating unit according to a first embodiment of the multiple pulse series generating device of the present invention will be now described in principle. The primary random pulse series generating unit according to the first embodiment comprises a linear feedback shift register and a data providing means. The linear feedback shift register comprises n flip-flop means that comprise a basic flip-flop device and (n-1) dependent flip-flop device(s), where n-1≧1. The basic and dependent flip-flop devices are coupled to each other in series so as to form a loop. The n flip-flop means are numbered from first to nth in arbitrary order so that the basic flip-flop device is to be a first flip-flop device. Each of these flip-flop devices provides a corresponding pseudo-random pulse series.

The data providing means provides, as a first primary random pulse series corresponding to the basic (first) flip-flop device, the pseudo-random pulse series provided from the above basic flip-flop device, as it is, without performing any modification thereto. With regard to the pseudo-random pulse series provided from the above dependent flip-flop device(s), the data providing means performs the following process for each dependent (ith) flip-flop device (where 1<i≦n). A logical-multiplication calculation is performed on: the pseudo-random pulse series provided from the dependent (ith) flip-flop device, and respective first through (i−1)th pseudo-random pulse series. The respective first through (i−1)th pseudo-random pulse series are obtained as a result of inverting the respective pseudo-random pulse series provided from the respective first through (i−1)th flip-flop devices. The logically multiplied result is provided as a ith primary random pulse series corresponding to the dependent (ith) flip-flop device. Thus, the data providing means provides the n series of primary random pulse series, a value n of the primary random pulse series being the same as the value n of the flip-flop devices of which the above linear feedback shift register is comprised.

Any one of the flip-flop devices constituting the above linear feedback shift register may be used as the above basic flip-flop device. Concretely, in FIG. 6, either a flip-flop device 104 or a flip-flop device 102 may be used as the basic flip-flop device.

In the above constitution of the primary random pulse series generating unit according to the first embodiment, because the means for providing the pseudo-random pulse series is comprised of the linear feedback shift register comprising the flip-flop devices, the linear feedback shift register is more effective in reducing the circuit scale of the random pulse series generating apparatus employing the primary random pulse series generating unit than the random pulse series generating apparatuses of the above related art that employing the ALU having a large scale.

Further, the above primary random pulse series generating unit of the first embodiment operates so that, with regard to the plurality of the primary random pulse series provided from the primary random pulse generating unit, one of the plurality of the primary random pulse series includes, for example, data "1" at a given moment, while all the plurality of the primary random pulse series other than the above one of the primary random pulse series include, for example, data "0" at the same moment. Such operations are executed no matter what the contents of data provided from the basic and dependent flip-flop devices are. Such operations result in that, as described above for the random pulse series generating apparatus of the second related art, the random pulse series generating apparatus having the combination of the above primary random pulse series generating unit with the up/down counter 46 can results in that the logical-multiplication calculation result therein becomes nearly equal to the corresponding arithmetic-multiplication calculation.

The principle of a primary random pulse series generating unit according to a second embodiment of the multiple pulse series generating device of the present invention will be now described. The primary random pulse series generating unit according to the second embodiment comprises a shift register and a data providing means. A difference between the primary random pulse series generating unit of the second embodiment and that of the first embodiment will now be described. In the primary random pulse series generating unit of the second embodiment, the above linear feedback shift register is provided with at least one additional flip-flop device coupled to the flip-flop devices constituting the linear feedback shift resistor in series. In an example of the primary random pulse series generating unit according to the second embodiment of the present invention shown in FIG. 7, an additional flip-flop device 120 is provided in the linear feedback shift register, and the additional flip-flop device 120 is inserted, in series, in a part of a loop circuit formed of the four flip-flop devices comprising (basic) flip-flop device 104 and the (dependent) flip-flop devices 101, 102, and 103. Output of the additional flip-flop device 120 is not used as an primary random pulse series output of the primary random pulse series generating unit.

The shift register having the above additional flip-flop device(s) thus has a first group of the flip-flop devices which are coupled to the data providing means and a second group of the flip-flop device(s) which is not coupled to the data providing means (the second group of the flip-flop device(s) comprise the additional flip-flop device(s)). The primary random pulse series generating unit using the above linear feedback shift register may operate as follows. Probabilities of pseudo-random pulse series generated from the data providing means comprise the following n kinds of probabilities:

$(2^{m+n-1})/(2^{m+n})$,
$(2^{m+n-2})/(2^{m+n})$, . . . ,
$(2^m)/(2^{m+n})$, where n flip-flop devices of n+m flip-flop devices constituting the linear feedback shift resistor are coupled to the data providing means, and other m flip-flop devices of the n+m flip-flop devices are not coupled to the data providing means. Accordingly, the primary random pulse series generating unit according to the second embodiment of the present invention is useful for reducing the pulse generating probabilities (pulse densities) of the corresponding pseudo-random pulse series.

Figure 5:
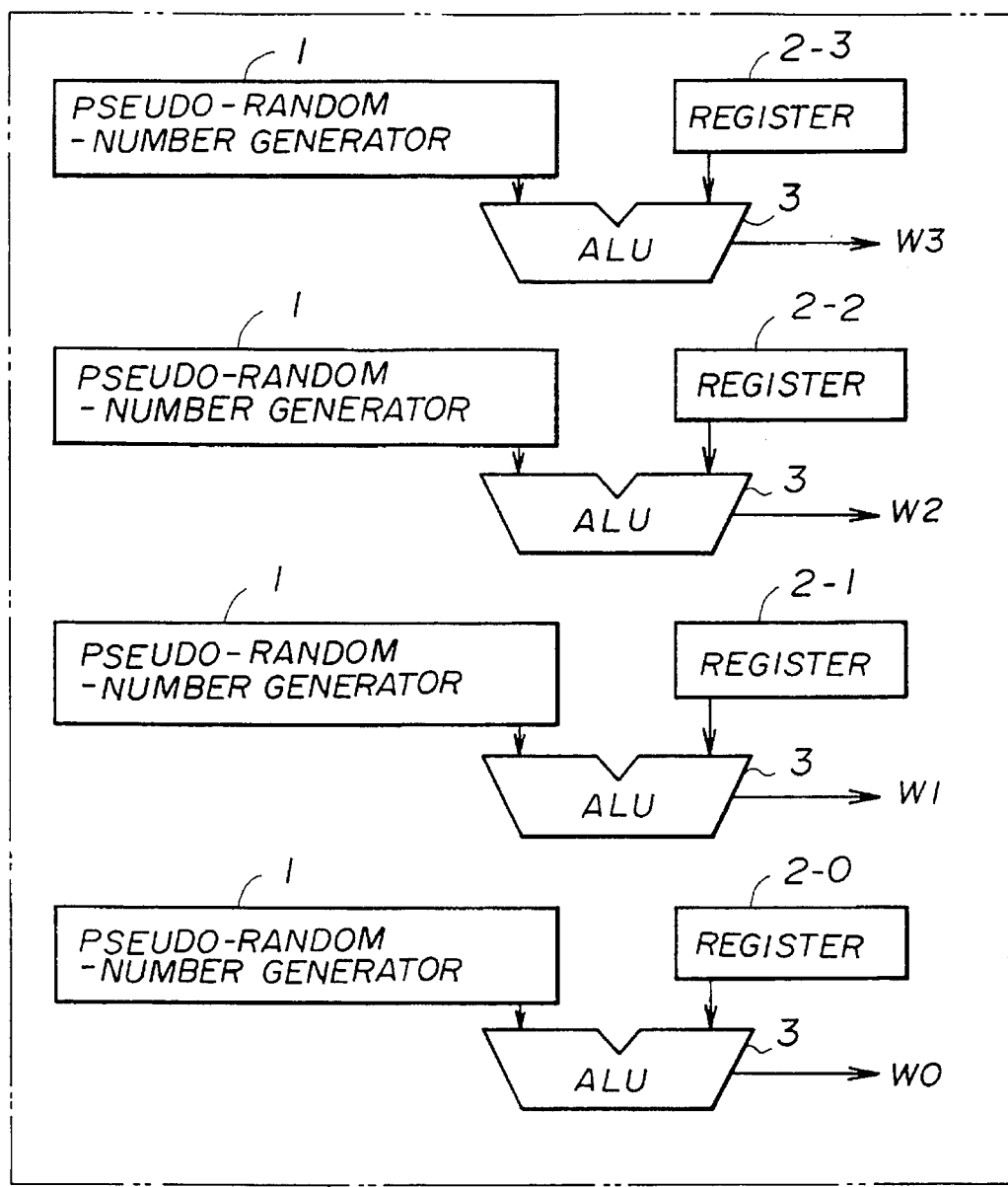
FIG. 5 shows a block diagram of a primary random pulse series generating unit shown in FIG. 4.
Figure 6:
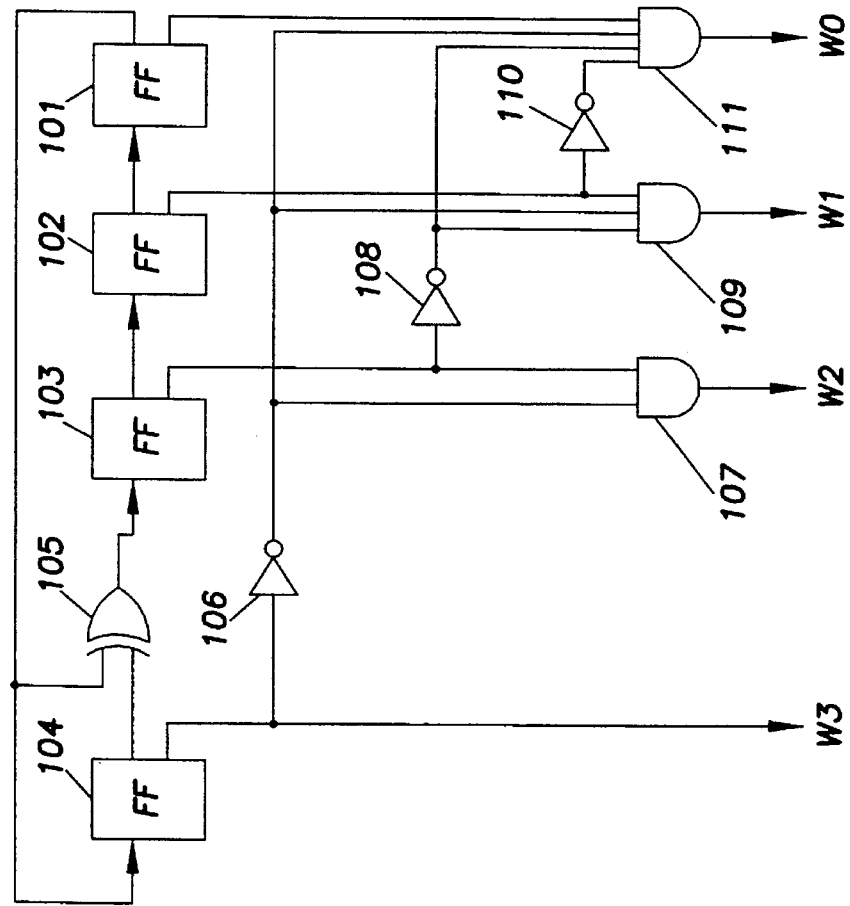
FIG. 6 shows a block diagram of a primary random pulse series generating unit according to a first embodiment of the multiple pulse series generating device of the present invention.

A circuit diagram of one example of a primary random pulse series generating unit according to the first embodiment of the present invention will now be described with reference to FIG. 6. A primary random pulse series generating unit 100 provides, in this example, 4 series of the primary random pulse series w3 through w0. These primary random pulse series w3 through w0 correspond to the series w3 through w0, respectively, mentioned above in the description of the random pulse series generating apparatus of the second related art shown in FIG. 5.

The primary random pulse series generating unit 100 has a linear feedback shift register comprising of the flip-flop devices 101 through 104 having 4 stages coupled to each other in series. In the linear feedback shift register, the non-inverted output terminal of a final stage of the flip-flop device 101 is connected to the data input terminal of a first stage of the flip-flop device 104. The non-inverted output terminal of the flip-flop device 104 is connected to one input terminal of an exclusive-OR device 105 having two input terminals, and the non-inverted output terminal of the flip-flop device 101 is connected to the other input terminal of the exclusive-OR device 105. The output terminal of the exclusive-OR device 105 is connected to the data input terminal of the flip-flop device 103.

The above flip-flop devices 104, 103, 102 and 101 are numbered as first, second, third and fourth flip-flop devices respectively. This numbering order is not limited to the above order, and any numbering order may be applied.

The inverted output terminal of the first flip-flop device (in this case, this is the device 104) is connected to an output terminal of the primary random pulse series generating unit 100, which output terminal provides the primary random pulse series w3. The inverted output terminal of the second flip-flop device (in this case, this is the device 103) is connected to one input terminal of AND device 107 having two input terminals, and the inverted output terminal of the flip-flop device 104 is further connected to the other input terminal of the AND device 107 via the inverter 106. The inverted output terminal of the third flip-flop device (in this case, this is the device 102) is connected to a first input terminal of the AND device 109 having three input terminals, and the inverted output terminal of the flip-flop device 104 is further connected to the second input terminal of the AND device 109 via the inverter 106. The inverted output terminal of the fourth flip-flop device (in this case this is the device 101) is connected to a first input terminal of an AND device 111 having four input terminals, and the inverted output terminal of the flip-flop device 104 is further connected to the second input terminal of the AND device 111 via the inverter 106.

The output terminal of the AND device 107 is connected to an output terminal of the primary random pulse series generating unit 100, which output terminal provides the primary random pulse series w2.

The inverted output terminal of the flip-flop device 103 is further connected to, via an inverter 108, the third input terminal of the AND device 109 and the third input terminal of the AND device 111. The inverted output terminal of the flip-flop device 102 is connected to, via an inverter 110, the fourth input terminal of the AND device 111. The output terminal of the AND device 109 is connected to an output terminal of the primary random pulse series generating unit 100, which output terminal provided the primary random pulse series w1, and the output terminal of the AND device 111 is connected to an output terminal of the primary random pulse series generating unit 100, which output terminal provides the primary random pulse series w0.

Figure 4:
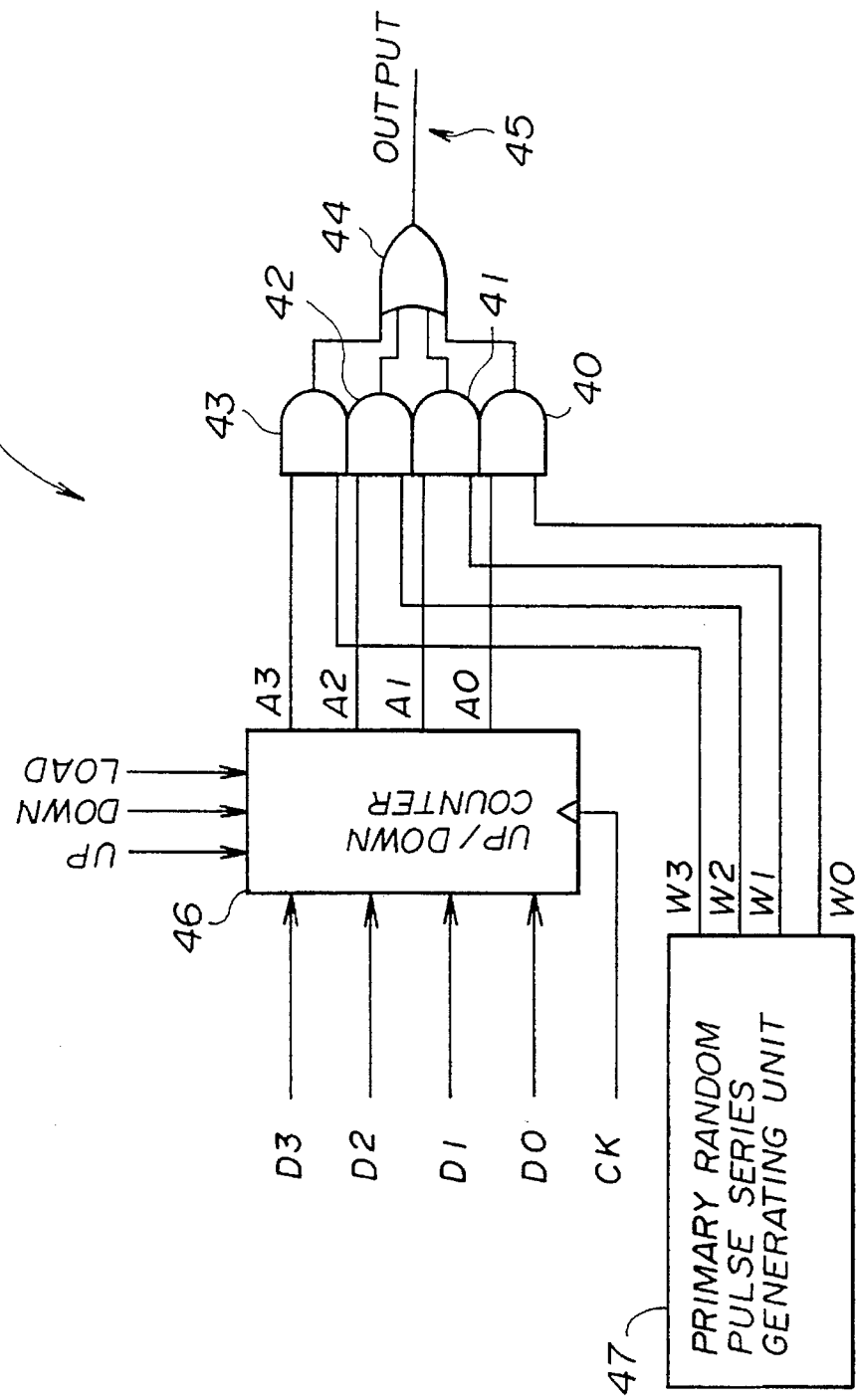
FIG. 4 shows a block diagram of a constitution of one example of a random pulse series generating apparatus in a second related art, which apparatus has been proposed by the present applicant.
Figure 9:
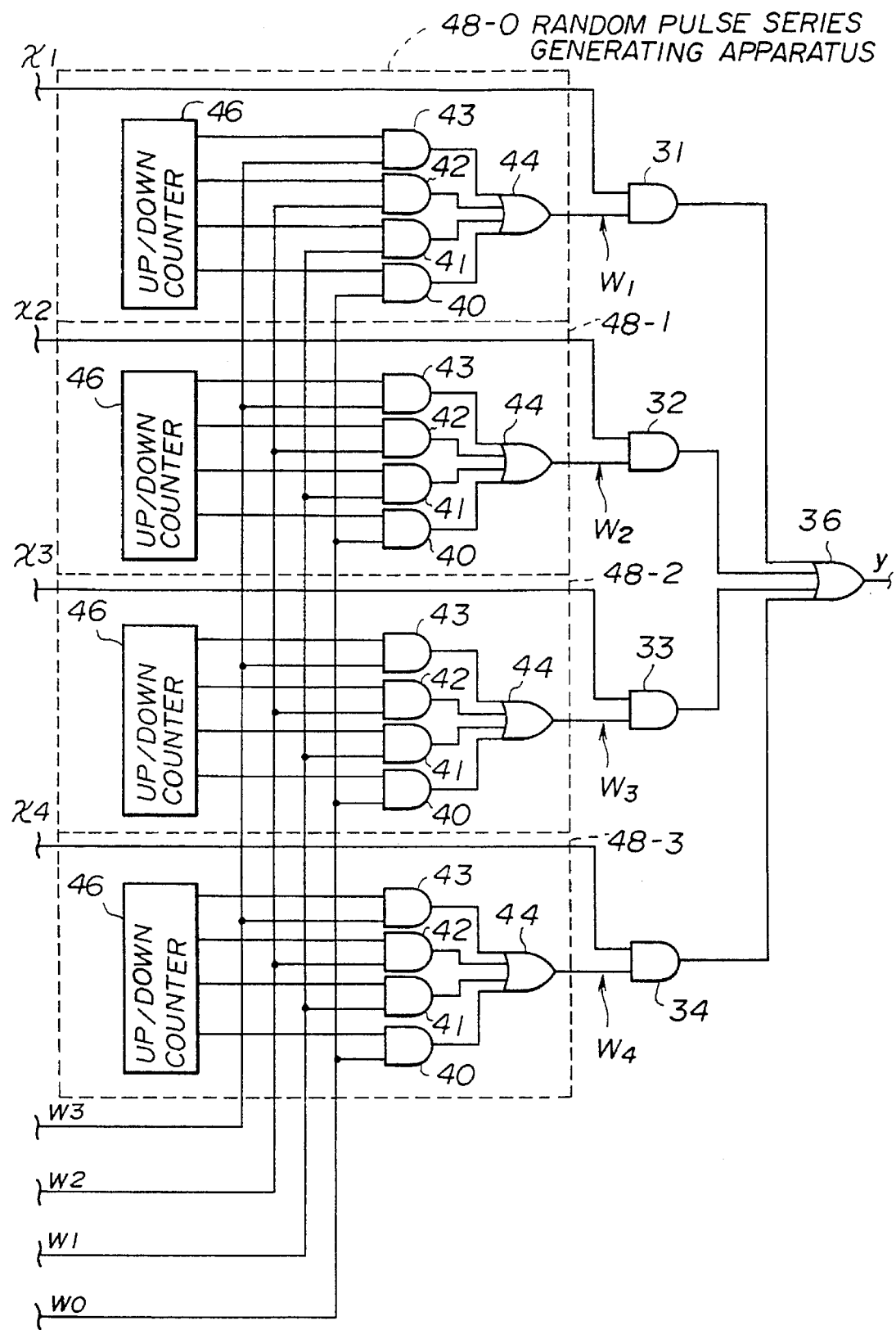
FIG. 9 shows a block diagram of a neural-network system random pulse series generating apparatus.

The data output terminal of the flip-flop device 104 providing the primary random pulse series w3 is connected to the input terminals of both the AND device 43 of the random pulse series generating apparatus 48 and the similar apparatuses show in FIG. 4 and/or FIG. 9. Similarly, the output terminals of the AND devices 107, 109, and 111 providing the primary random pulse series w2 through w0 respectively are connected to the input terminals of the respective AND devices 43 through 40, respectively, of the random pulse series generating apparatus 48 and the similar apparatuses show in FIG. 4 and/or FIG. 9.

The number of the flip-flop devices employed by the linear feedback shift register of the primary random pulse series generating unit according to the first embodiment of the present invention corresponds to the number of the AND devices employed by each random pulse series generating apparatus 48. Such numbers may be a value that is not less than "2". Further, the coupled position of the exclusive-OR device 105 in the loop of the linear feedback shift register formed of the exclusive-OR device 105 and the flip-flop devices 101 through 104 is not limited to the position shown in FIG. 6, and the position may vary in the loop. Furthermore, a plurality of exclusive-OR devices may be provided so as to form the loop of the linear feedback shift register.

Figure 11:
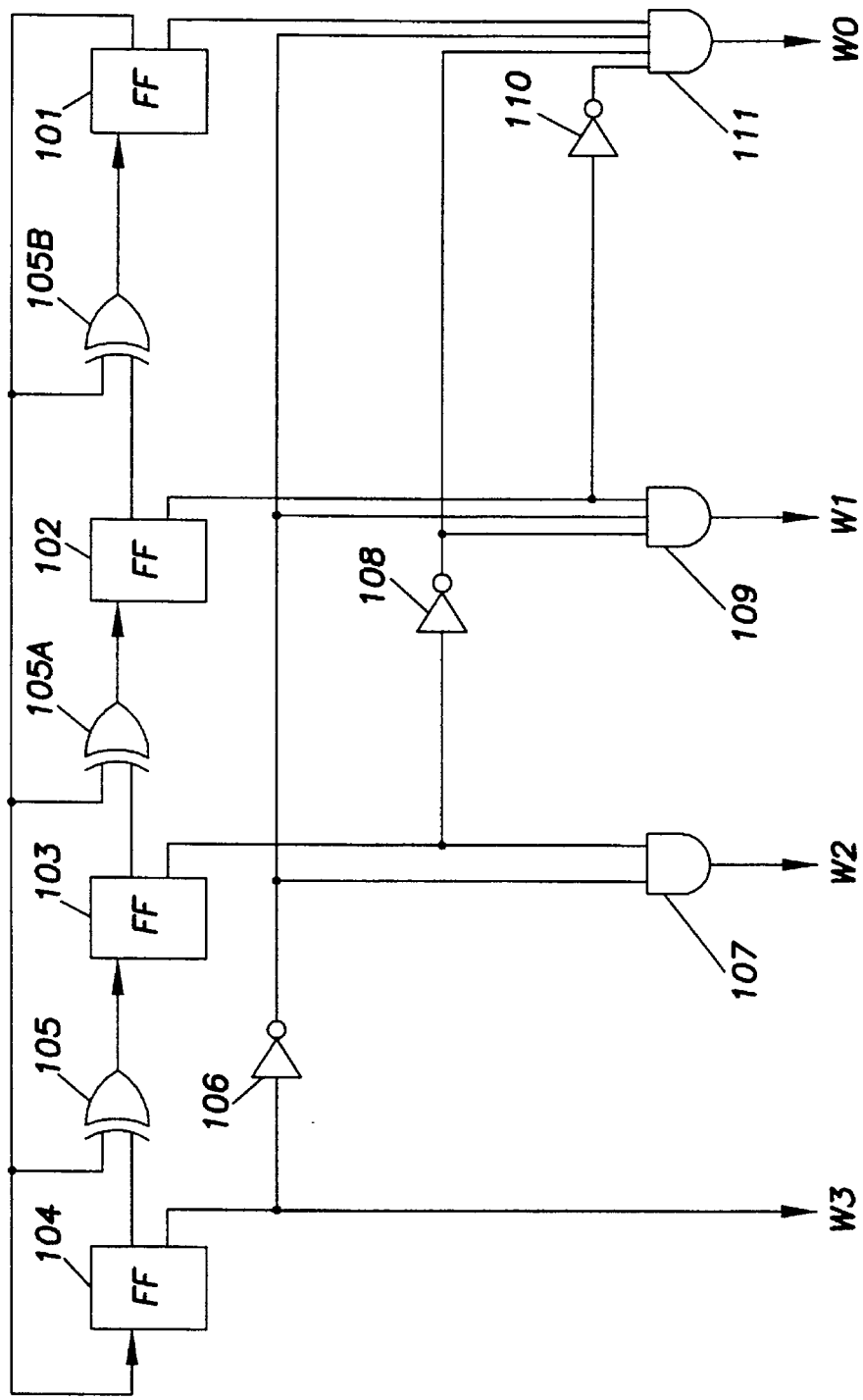
FIG. 11 shows a block diagram of a primary random pulse series generating unit according to a third embodiment of the multiple pulse series generating device of the present invention.

Another primary random pulse series generating unit 150 according to a third embodiment of the multiple pulse series generating device of the present invention results from adding other exclusive-OR devices 105A, and 105B to that of FIG. 6 will now be described with reference to FIG. 11. Furthermore, various variation concerning the coupled position and a number of exclusive-OR devices provided in the linear feedback shift resistors can be devised by referring to the following references: a article "Functions of Linear Feedback Shift Registers" in the publication NIKKEI ELECTRONICS, Jun. 6th, 1983, pages 126 and 127, published by Nikkei BP company, 3-3-23, Misakicho, Chiyodaku, Tokyo, Japan; and an article "Feedback Shift Registers For Self-Testing Circuits" in the publication VSLI SYSTEMS DESIGN, December 1986, pages 50–58, published by CMP Publications, Inc., 600 Community Drive, Manhasset, N.Y. 11030, U.S.A.

Figure 12:
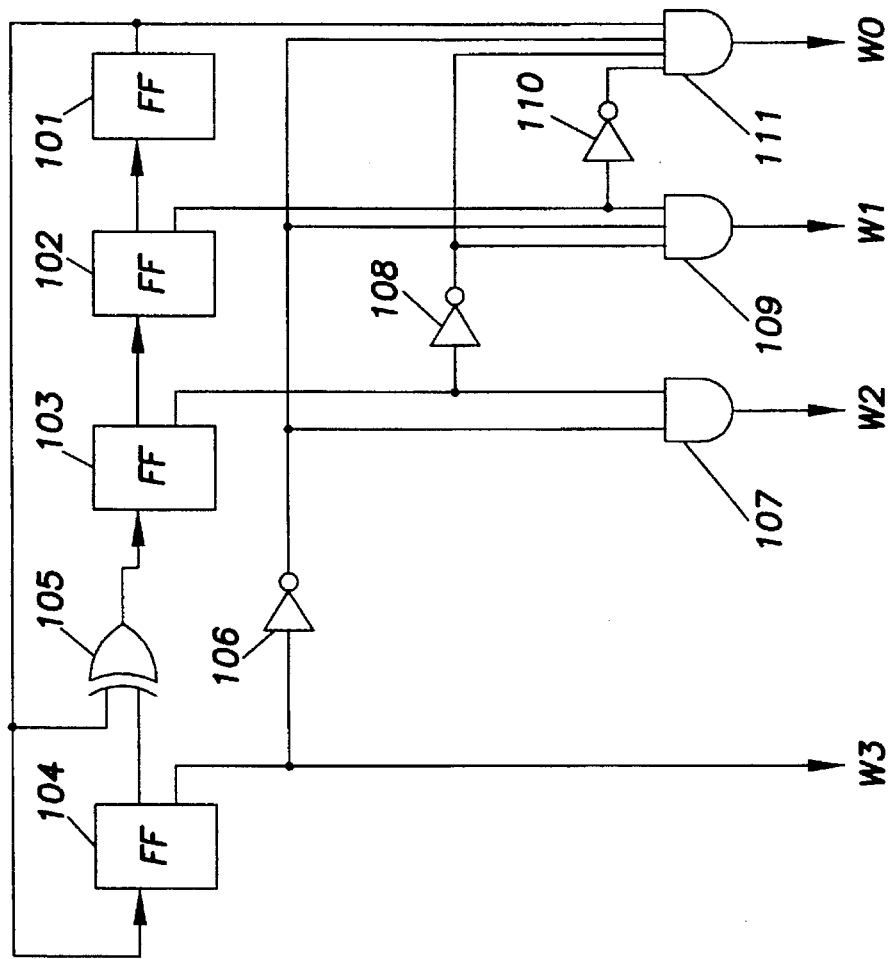
FIG. 12 shows a block diagram of a primary random pulse series generating unit according to a fourth embodiment of the multiple pulse series generating device of the present invention.

Furthermore, another primary random pulse series generating unit 160 according to a fourth embodiment of the multiple pulse series generating device of the present invention will now be described with reference to FIG. 12. In the unit 160, only one output terminal is used for each flip-flop device in the linear feedback shift register, and this common output terminal of the flip-flop device is used both for forming a loop circuit comprising the flip-flop devices and for coupling the common output terminal to the data providing means comprising the inverters 106, 108, and 110 and the AND devices 107, 109 and 111.

Figure 10:
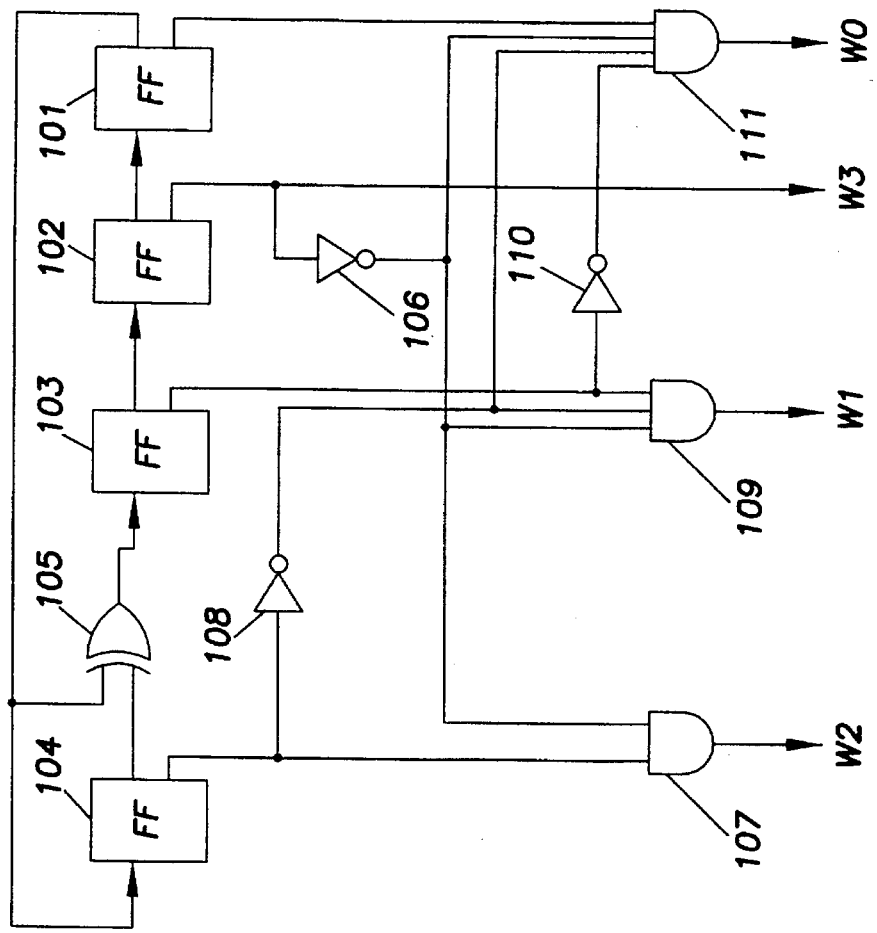
FIG. 10 shows a block diagram of a primary random pulse series generating unit according to a fifth embodiment of the multiple pulse series generating device of the present invention.

Furthermore, in the primary random pulse series generating unit 100, the flip-flop device 104 is used as the basic flip-flop device, and the output of the flip-flop device 104 is used as the primary random pulse series accordingly. However, the basic flip-flop device is not limited to the case of FIG. 6 in which the flip-flop device located in the leftmost side of FIG. 6 is used as the basic flip-flop device, that is, in which the basic flip-flop device is allocated to the uppermost-stage flip-flop device. On the other hand, for example, the flip-flop device 102 may be used as the basic flip-flop device. A primary random pulse series generating unit 140 according to a fifth embodiment of the multiple pulse series generating device of the present invention, the constitution of which is obtained as a result of the above use, will now be described with reference to FIG. 10. In the unit 140, the flip-flop devices are numbered so that the flip-flop device 102 is the first one (basic one), the flip-flop device 104 is the second one (dependent one), the flip-flop device 103 is the third one (dependent one), and the flip-flop device 101 is the fourth one (dependent one). Thus, the inverted output terminal of the first flip-flop device (102) is connected to an output terminal, of a primary random pulse series generating unit, which output terminal provides the primary random pulse series w3. The inverted output terminal of the second flip-flop device (104) is connected to one input terminal of the AND device 107 having two input terminals. The inverted terminal of the first flip-flop device (102) is further connected to, via the inverter 106, the other input terminal of the AND device 107 having two input terminals. The inverted output terminal of the third flip-flop device (103) is connected to a first input terminal of the AND device 109 having three input terminals. The inverted terminal of the first flip-flop device (102) is further connected to, via the inverter 106, the second input terminal of the AND device 109 having three input terminals. The inverted output terminal of the fourth flip-flop device (101) is connected to a first input terminal of the AND device 111 having four input terminals. The inverted terminal of the first flip-flop device (102) is further connected to, via the inverter 106, the second input terminal of the AND device 111 having four input terminals. Further, the inverted output terminal of the second flip-flop device (104) is connected to, via the inverter 108, the third input terminal of the AND device 109 having three input terminals and the third input terminal of the AND device 111 having four input terminals. The inverted output terminal of the third flip-flop device (103) is connected to, via the inverter 110, the fourth input terminal of the AND device 111 having four input terminals. The output terminal of the above AND device 107 having two input terminals is connected to the output terminal, of the primary random pulse series generating unit 140, which output terminal provides the primary random pulse series w2. The output terminal of the AND device 109 having three input terminals is connected to the output terminal of the primary random pulse series generating unit 140, which output terminal provides the primary random pulse series w1. The output terminal of the AND device 111 having four input terminals is connected to the output terminal of the primary random pulse series generating unit 140, which output terminal provides the primary random pulse series w0.

Further, numbering other than that in the unit 140 may be possible, and the primary random pulse series generating unit according to the sixth embodiment of the multiple pulse series generating device of the present invention will now be described. In this unit, the numbering of the flip-flop devices are executed so that the flip-flop device 102 is the first one (basic one), the flip-flop device 101 is the second one (dependent one), the flip-flop device 104 is the third one (dependent one), and the flip-flop device 103 is the fourth one (dependent one). Thus, the inverted output terminal of the first flip-flop device (102) is connected to an output terminal of a primary random pulse series generating unit, which output terminal provides the primary random pulse series w3. The inverted output terminal of the second flip-flop device (101) is connected to one input terminal of the AND device 107 having two input terminals. The inverted terminal of the first flip-flop device (102) is further connected to, via the inverter 106, the other input terminal of the AND device 107 having two input terminals. The inverted output terminal of the third flip-flop device (104) is connected to a first input terminal of the AND device 109 having three input terminals. The inverted terminal of the first flip-flop device (102) is further connected to, via the inverter 106, the second input terminal of the AND device 109 having three input terminals. The inverted output terminal of the fourth flip-flop device (103) is connected to a first input terminal of the AND device 111 having four input terminals. The inverted terminal of the first flip-flop device (102) is further connected to, via the inverter 106, the second input terminal of the AND device 111 having four input terminals. Further, the inverted output terminal of the second flip-flop device (101) is connected to, via the inverter 108, the third input terminal of the AND device 109 having three input terminals and the third input terminal of the AND device 111 having four input terminals. The inverted output terminal of the third flip-flop device (104) is further connected to, via the inverter 110, the fourth input terminal of the AND device 111 having four input terminals. The output terminal of the above AND device 107 having two input terminals is connected to the output terminal of the primary random pulse series generating unit 140, which output terminal provides the primary random pulse series w2. The output terminal of the AND device 109 having three input terminals is connected to the output terminal of the primary random pulse series generating unit 140, which output terminal provides the primary random pulse series w1. The output terminal of the AND device 111 having four input terminals is connected to the output terminal of the primary random pulse series generating unit 140, which output terminal provides the primary random pulse series w0.

Operations of the primary random pulse series generating unit 100 of FIG. 6 will now be described.

A part of the generating unit 100 comprising the four flip-flop devices 101 through 104, after outputting 15 ($=2^4-1$) kinds of values randomly, then returns to the initial state thereof. Generally speaking, repeated random-number output of a primary random pulse series generating unit, being provided with n sets of flip-flop devices, has a cycle, each period of which comprises $2^n-1$ periods.

Other variations of the above-mentioned constitution of a primary random pulse series generating unit may be devised. For devising the variations, it is necessary to consider that the linear feedback shift register loop provided with n sets of flip-flop devices outputs a group of values repeatedly for each cycle of $2^n-1$ periods, and the common group of values are output for each cycle.

The primary random pulse series w3 comprises data output from the inverted output terminal of the flip-flop device 104, and the flip-flop device 104 generates, as mentioned above, the common group of values for each cycle of 15 periods. The pulse density in which the flip-flop device 104 generates data "1", in a case where, for example, the frame F is defined as 16, is given as $(2^3)/16$ accordingly.

The primary random pulse series w2 comprises, as mentioned above, data provided from the output terminal of the AND device 107. The primary random pulse series w2 may become "1" only when data provided from the inverted output terminal of the flip-flop device 104 is "0" and data provided from the inverted output terminal of the flip-flop device 103 is "1". Thus, the pulse density of the series w2 is, in the case where, for example, the frame F is defined as 16, is given as $(2^2)/16$ accordingly.

The primary random pulse series w1 comprises, as mentioned above, data provided from the output terminal of the AND device 109. The primary random pulse series w1 may become "1" only when both kinds of data provided from the inverted output terminals of the flip-flop devices 104 and 103 are "0" respectively and data provided from the inverted output terminal of the flip-flop device 102 is "1" Thus, the pulse density of the series w2 is, in the case where, for example, the frame F is defined as 16, is given as $(2^1)/16$ accordingly.

The primary random pulse series w0 comprises, as mentioned above, data provided from the output terminal of the AND device 111. The primary random pulse series w0 may become "1" only when three kinds of data provided from the inverted output terminals of the flip-flop devices 104, 103, and 102 are "0" respectively and data provided from the inverted output terminal of the flip-flop device 101 is "1". Thus, the pulse density of the series w2 is, in the case where, for example, the frame F is defined as 16, is given as $(2^0)/16$ accordingly.

Further, the primary random pulse series generating unit 100, having the inverters 106, 108 and 110 and the AND devices 107, 109 and 111, thus provides the primary random pulse series such that a plurality of series from among the primary random pulse series w3 through w0 cannot be "1" simultaneously. Thus, the unit 100 can provide the pseudo-random pulse series having the predetermined random pulse densities. Further, in the case where the random pulse series generating apparatus of the above second related art shown in FIG. 4 employs the primary random pulse series generating unit according to the first embodiment of the present invention, the circuit scale of the apparatus may be greatly reduced because the ALU having the large circuit scale is eliminated, in contrast to the case where the primary random pulse series generating unit 47 of the second related art as shown in FIG. 5 is employed, in which case, the circuit scale can not be reduced greatly.

Figure 7:
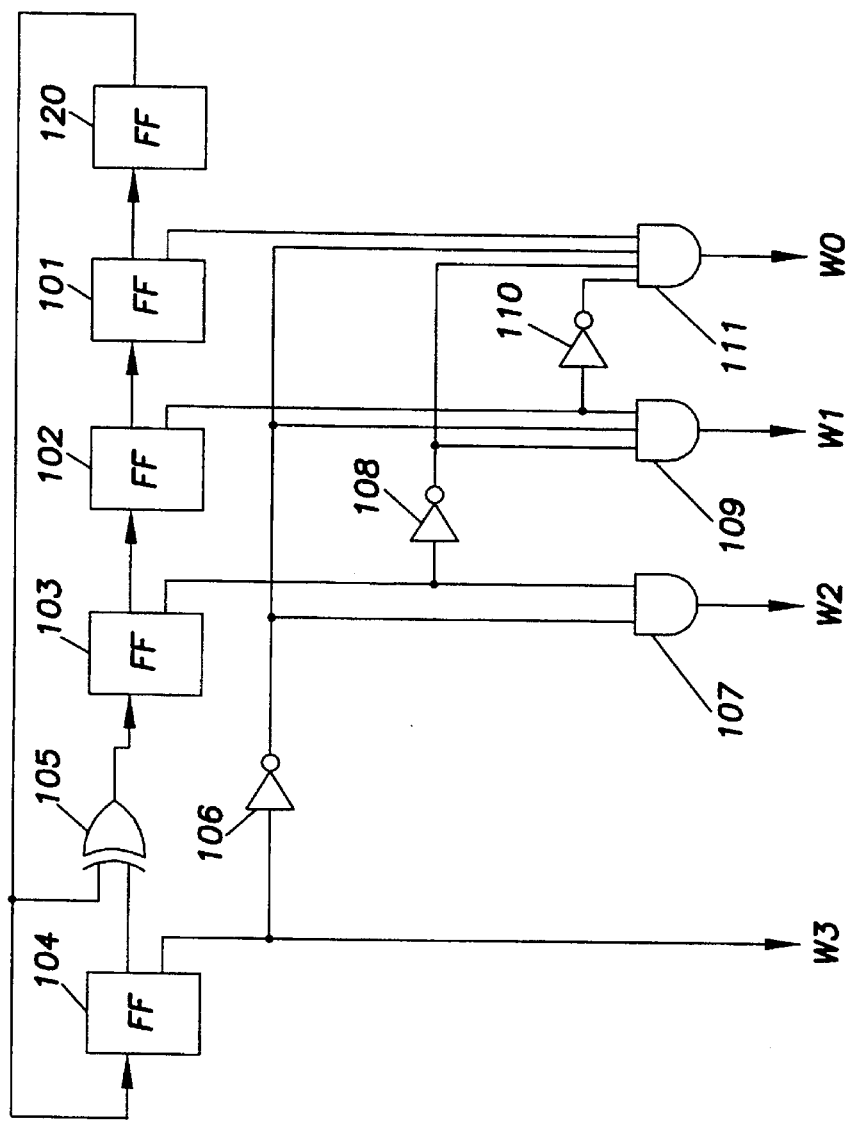
FIG. 7 shows a block diagram of a primary random pulse series generating unit according to a second embodiment of the multiple pulse series generating device of the present invention.

Another example resulting from a variation of the primary random pulse series generating unit 100 is shown in FIG. 7. The primary random pulse series generating unit 130 of FIG. 7 is one example of the second embodiment of the present invention. As shown in FIG. 7, it is not necessary to provide an inverter and an AND device for each of the flip-flop devices used in the primary random pulse series generating unit. An example of this constitution is shown in FIG. 7, in which, in this example, one flip-flop device 120 is added next the lowermost stage of the flip-flop device 101, and thus a total of five flip-flop devices are employed in the primary random pulse series generating unit 130. In the unit 130, the inverters and the AND devices are coupled only to the flip-flop devices 104 through 101 which are used to provide the primary random pulse series w3 through w0, which flip-flop devices are coupled to the additional flip-flop device 120 at the upper side of the flip-flop device 120, and the inverted output terminal of the additional flip-flop device 120 is not used.

In this primary random pulse series generating unit 130, the respective probabilities of generating "1" in the respective primary random pulse series w3 through w0 are given as being nearly equal to: $(2^4)/32=1/2$; $(2^3)/32=1/4$; $(2^2)/32=1/8$; and $(2^1)/32=1/16$. These probabilities are nearly equal to those ones respectively in the primary random pulse series generating unit 100 using four flip-flop devices 101 through 104. Further, the repeated primary random pulse series provided from the primary random pulse series generating unit 130 has a cycle of 31 ($=2^{5-1}$) periods, and the correlation between two series from among the primary random pulse series provided from the generating unit 130 can become close.

Further, any variation concerning the inserted position(s) and the number of additional flip-flop devices to be inserted, in series, in the loop circuit formed of the flip-flop devices and the exclusive OR device of the linear feedback shift resistors is permitted. That is, any position(s) (a plurality of arbitrary positions is also allowed) in the loop circuit is allowed to have the additional flip-flop device(s) inserted therein and any number of the additional flip-flop devices can be permitted to be inserted in each position of the loop circuit.

The primary random pulse series w3 through w0 are supplied to, for example, the AND devices 43 through 40 shown in FIG. 4 respectively, similar to the manner in which the primary random pulse series generating unit 47 of the above second related art supplies the devices 40 through 43. Operations of the random pulse series generating apparatus 48 executed after the primary random pulse series generating unit 100 supplies the primary random pulse series w3 through w0 to the devices 40 through 43 will now be described.

The up/down counter 46 supplies the respective bit data of the above random pulse density determination data to the respective AND devices 40 through 43 in parallel, synchronous with a clock signal provided from the outside. Further, the primary random pulse series w0 through w3 provided from the primary random pulse series generating unit 100 are provided to the AND devices 40 through 43 respectively, synchronous with the above clock signal.

The AND devices 43 through 40 perform logical-multiplication calculations on both the provided data, synchronous with the above clock signal, respectively, and the devices 43 through 40 provide the results of the logical-multiplication calculations respectively to the OR device 44.

The OR device 44 performs, synchronous with the above clock signal, a logical-addition calculation on the results of the above logical-multiplication calculations provided from the AND devices 43 through 40 respectively, and the OR device 44 then provides the result of the logical-addition calculation as a series of pseudo-random pulse series. A concrete example of each output data will be described in later appropriate parts in this specification.

Use of the primary random pulse series generating unit 100, having the above-mentioned constitution, as the primary random pulse series generating unit 47 thus results in the circuit scale of the unit 47 being reduced. Further, the constitution of the primary random pulse series generating unit 100 results in the following advantage.

The relationship among the primary random pulse series w0 through w3 provided from the primary random pulse series generating unit 100 with respect to the pulse densities thereof is, as mentioned above, such that w0<w1<w2<w3.

Output data to be provided by the OR device 44 having four input terminals, which four input terminals are connected with the output of the AND devices (each having two input terminals) respectively, can be expressed by the following logical expression A:

$$D0 \cdot w0 + D1 \cdot w1 + D2 \cdot w2 + D3 \cdot w3 \qquad (A),$$

where the symbol "·" indicates a logical-multiplication calculation, the symbol "+" indicates a logical-addition calculation, and the respective symbols D0 through D3 indicate the respective output data provided from the above output terminals A0 through A3 respectively.

The logical-multiplication calculations are performed on the primary random pulse series w0 through w3, which have the pulse densities thereof determined as mentioned above respectively, for the respective bit positions of the output data D0 through D3 provided by the up/down counter 46. The logical-addition calculation is then performed on the results of the above logically multiplying. Thus, as shown in the above logical expression (A), the greater the values stored in the up/down counter 46 are, (that is, the greater the above data D0 through D3 are,) the greater the pulse density of the pseudo-random pulse series provided by the OR device 44 becomes. On the other hand, the smaller the values stored in the up/down counter 46 are, the smaller the above pulse density becomes.

As described above, in the random pulse generating apparatus 48, causing the random pulse determination data stored in the up/down counter 46 to vary results in the pulse density of the pseudo-random pulse series to be provided by the OR device 44. Thus, adjusting of the above primary random pulse series such as w3 results in pseudo-random pulse series being provided by the OR device 44 so that the pulse density of the pseudo-random pulse series corresponds to the magnitude of the above random pulse density determination data.

In the case where the pulse densities of the primary random pulse series w0 through w3, which are provided from the primary random pulse series generating unit 100, are fixed as in an order starting from the minimum one, $2^0$, $2^1$, ..., the above logical expression (A) is expressed by the following logical expression (B):

$$D0 \cdot 2^0 + D1 \cdot 2^1 + D2 \cdot 2^2 + D3 \cdot 2^3 \qquad (B).$$

The logical expression B is, except for the contents of the logical expression being a logical expression, identical to an expression, expressed in the corresponding binary number, of the random pulse density determination data of the up/down counter 46, where the data D0 through D3 have fixed values "1" or "0" respectively. Further, when a frame of pulse series such as mentioned above is named F, a value of F is greater than the value of $2^3$. $2^0$ through $2^3$ correspond to the respective magnitudes of the pulse densities $2^0/F$, $2^1/F$, $2^2/F$, and $2^3/F$.

Figures 8A, 8B, 8C, 8D, 8E:
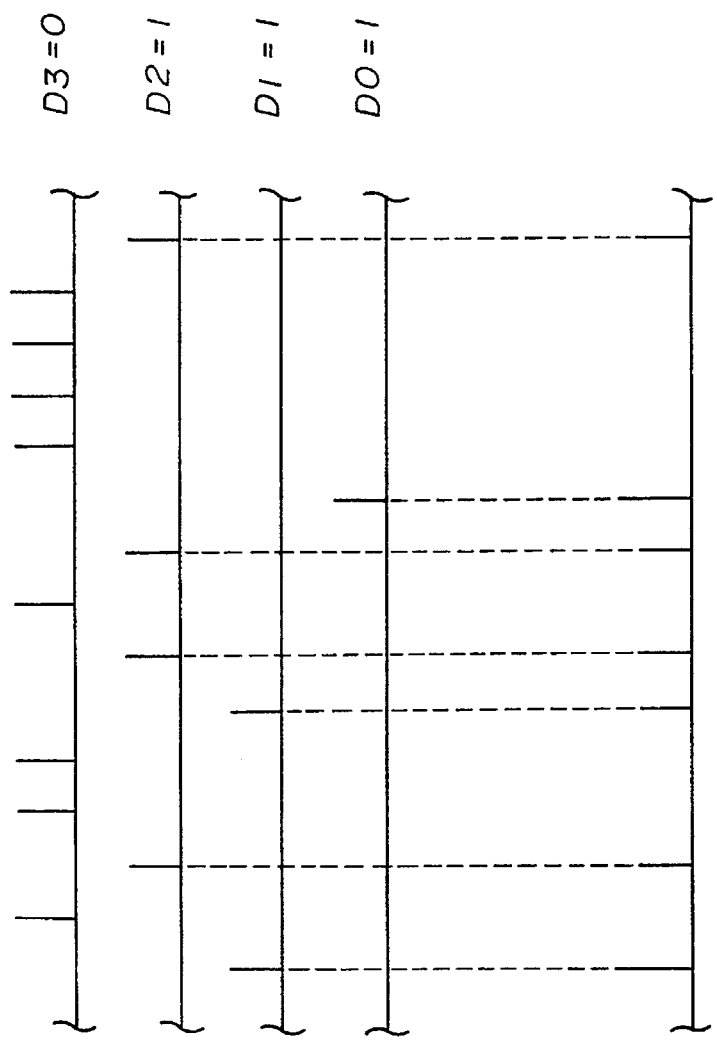
FIGS. 8A through 8E show time charts of pseudo-random pulse series provided by a primary random pulse series generating unit.

Such pulse densities will now be described concretely with reference to FIGS.8A through 8E. In an example of the above value F being assigned value 16, the primary random pulse series w3 provided by the primary random pulse series generating unit 100 has a pulse density of, as shown in FIG. 8A, $2^3/F$, that is, 8/16. Similarly, the primary random pulse series w2 has a pulse density of, as shown in FIG. 8B, $2^2/F$, that is, 4/16, the primary random pulse series w1 has a pulse density of, as shown in FIG. 8C, $2^1/F$, that is, 2/16, and the primary random pulse series w0 has a pulse density of as shown in FIG. 8B, $2^0/F$, that is, 1/16.

The most significant bit (the leftmost bit) D3 of random pulse density determination data stored in the up/down counter 46 is, similarly to the above description, supplied to the AND device 43, the second significant bit (the next bit of the most significant bit D3) D2 of the random pulse density determination data is supplied to the AND device 42, the second least significant bit D1 (the next bit of the bit D2) of the random pulse density determination data is supplied to the AND device 41, and the least significant bit (the next bit of the bit D1) D0 of the random pulse density determination data is supplied to the AND device 40.

In a case where the above random pulse density determination data (D3 D2 D1 D0) has a value (0 1 1 1), (both are expressed in binary number) the AND devices 43 through 40 perform logical-multiplication calculations on the primary random pulse series w3 through w0 each having the above-mentioned pulse densities and the above random pulse density determination data (0 1 1 1). The OR device 44 then performs a logical-addition calculation on the results of the logical multiplying. As a result, as shown in FIGS.8A through 8E, a pseudo-random pulse series (FIG. 8E) provided by the OR device 44 does not comprise pulses corresponding to the primary random pulse series w3 that has the greatest pulse density, because the most significant bit of the random pulse density determination data corresponding to the primary random pulse series w3 is "0". Thus, the pseudo-random pulse series (FIG. 8E) provided by the OR device 44 comprises the result of logically adding of the primary random pulse series w2 through w0 together.

As a result, as shown in FIG. 8E, the pulse density of the pseudo-random pulse series (FIG. 8E) provided by the OR device 44 becomes 7/F. The same result can be obtained as a result of substituting the respective bit data 0, 1, 1, and 1 of the above value (0 1 1 1) of the random pulse density determination data for D3, D2, D1, and D0 of the above logical expression (B), that is, D0=1, D1=1, D2=1 and D3=0, where the logical expression (B) is used as a corresponding arithmetic expression by reading the symbols "·" and "+" as symbols of the corresponding arithmetic calculations.

The logical (not arithmetic) calculation is multiple pulse series generating device acting as the actually executed in the random pulse series generating apparatus 48. Thus, if not less than two series of the primary random pulse series w0, w1, w2 and w3 were "1" simultaneously, when the output data, provided by the up/down counter 46, corresponding to these series of the primary random pulse series were "1" respectively, output data to be provided by the OR device 44 would be "1". Thus, the result would not be identical to one obtained from the corresponding arithmetic calculation.

However, the primary random pulse series generating unit 100, having the data providing means comprising the AND device 107, 109, and 111 and the inverters 106, 108 and 110, as mentioned above, thus does not output a plurality of "1" data pulses simultaneously. Thus, the resulting data of the above logical expression (B) is identical to the result of the corresponding arithmetic calculation. That is, a value of a numerator of a fraction, which expresses a pulse density of pseudo-random pulse series to be provided by the OR device 44, that is, "7" in this example, becomes identical to a value stored in the up/down counter 46, that is, the binary numeral expression (0 1 1 1) (corresponding to a value of decimal numeral expression "7") in this example.

That is, in the random pulse series generating apparatus 48 employing the primary random pulse series generating unit 100 according to the first embodiment according to the present invention as the primary random pulse series generating unit 47 in FIG. 4, the following operations are executed. The primary random pulse series generating unit 100 provides primary random pulse series, wherein, when the provided primary random pulse series are expressed in the corresponding fractions as mentioned above, numerators of the fractions, that is, a number of pulses occurring per frame are values obtained as a result of raising 2 to the several times powers (that is, for example, $2^0 2^1 2^2 2^3 2^4 \ldots$). Further, random pulse density determination data is caused to correspond to the numerator values, so that the random pulse density determination data starting from LSB toward MSB in this order correspond to the numerator values $2^0$, $2^1$, $2^2$, ... in this order respectively. Then, these values are provided to the AND devices 40 through 43, and the output of the AND devices are added by the OR device 44. Thus, pseudo-random pulse series, a pulse density of which pseudo-random pulse series is identical to a value obtained as a result of treating each bit data of the random pulse density determination data as each bit of a binary number, can be provided by the OR device 44. That is, it is possible to control quantitatively pseudo-random pulse series to be provided by the OR device 44 by varying a value stored in the up/down counter 46.

Figure 3:
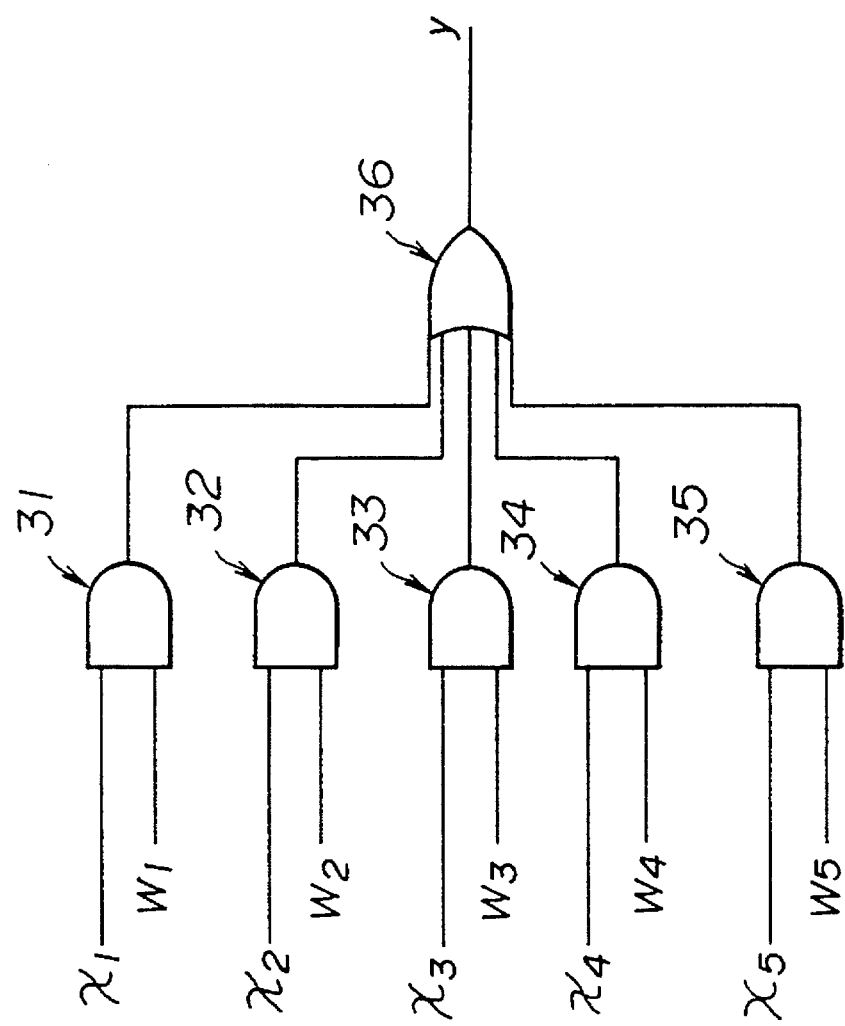
FIG. 3 shows a logical circuit diagram in which a logical circuit output, to be provided from the neuron constituting the neural network system, is produced by means of logical-multiplication calculations and a logical-addition calculation.

The above mentioned is a description concerning the random pulse series generating apparatus 48 employing the primary random pulse series generating unit 100 the same as the unit 47. Further, the present applicant has already proposed, as shown in FIG. 9, that the random pulse series generating apparatus 48 be applied to a neural network system. The neural network system of FIG. 9 has a constitution used for processing four-bit data (the random pulse series generation apparatus 48 also has a constitution used for processing four-bit data) and thus the random pulse series generating apparatus 48 can be applied to the neural network system of FIG. 9. The neural network system of FIG. 9 is one example of systems, in which four random pulse generating apparatuses are provided therein. Common reference numerals are used in FIG. 9 for common devices respectively, which have the common reference numerals are also used in FIGS. 3 and 4, and the description for the common devices are omitted. Random pulse series generating apparatuses 48-0 through 48-3 have constitutions substantially the same as that of the apparatus 48 of FIG. 4, and clock (CK) signals, LOAD signals and other signals, provided to the respective up/down counters 46 are omitted in FIG. 9.

The output terminal of the primary random pulse series generating unit 100, which output terminal provides the primary random pulse series w3, is connected to the respective AND devices 43 of the respective random pulse series generating apparatus 48-0 through 48-3. The output terminal of the primary random pulse series generating unit 100, which output terminal provides the primary random pulse series is connected to the respective AND devices 42 of the respective random pulse series generating apparatus 48-0 through 48-3. The output terminal of the primary random pulse series generating unit 100, which output terminal provides the primary random pulse series w1, is connected to the respective AND devices 41 of the respective random pulse series generating apparatus 48-0 through 48-3. The output terminal of the primary random pulse series generating unit 100, which output terminal provides the primary random pulse series w0, is connected to the respective AND devices 40 of the respective random pulse series generating apparatus 48-0 through 48-3.

The output of the output terminal of the OR devices 44 of the random pulse series generating apparatus 48-0 is supplied to an AND device 31 to which input data x1 is also provided. The output of the output terminal of the OR devices 44 of the random pulse series generating apparatus 48-1 is supplied to an AND device 32 to which input data x2 is also provided. The output of the output terminal of the OR devices 44 of the random pulse series generating apparatus 48-2 is supplied to an AND device 33 to which input data x3 is also provided. The output of the output terminal of the OR devices 44 of the random pulse series generating apparatus 48-3 is supplied to an AND device 34 to which input data x4 is also provided. The output of the output terminal of the OR devices 44 of the random pulse series generating apparatus 48-0 is supplied to an AND device 31 to which input data x1 is also provided. Output terminals of these AND devices 31 through 34 are connected to an OR device 36. Such constitutions of the AND devices 31 through 34 and the OR device 36 are similar to that of the logical circuit of FIG. 3. In an actual neural network system large number of parts each comprising a part such as, for example, the random pulse series generating apparatus 48-0 and the AND device 31, are provided therein, and primary random pulse series w0, w1, w3, . . . , a number of which is the same as the number of the above parts, are provided from the primary random pulse series generating unit 100. The primary random pulse series generating unit 100 can be formed with a relatively small circuit scale as mentioned above. Thus, it is possible that, for example, the primary random pulse series generating unit 100 may be formed on a common circuit substrate with the random pulse series generating apparatuses 48-0 through 48-3, and it is also possible to form the primary random pulse series generating unit 100 separately from the random pulse series generating apparatuses 48-0 through 48-3.

Operations of the above neural network system (employing random pulse series generating apparatuses) will now be described.

Operations of the random pulse series generating apparatuses 48-0 through 48-3, having been described above, are omitted. The AND devices 31 through 34 perform respective logical-multiplication calculations on respective series W1, W2, W3 and W4 of pseudo-random pulse series, provided by the respective OR devices 44 of the respective random pulse series generating apparatuses 48-0 through 48-3, and respective input data x1, x2, x3 and x4 respectively, both respective data being provided to the respective AND devices 31 through 34. The OR device 36 then performs a logical-addition calculation on the respective results of logical multiplying by the respective AND devices 31 through 34, which results are provided to the OR device 36.

Each series of the pseudo-random pulse series W1, W2, W3, and W4 is output as a result of being respectively weighed, as mentioned above, by using the corresponding up/down counter 46 and by using the primary random pulse series w0, w1, w2, and w3. Thus, the pseudo-random pulse series W1, W2, W3, and W4 perform respective weighing on the input signals x1, x2, x3, and x4 respectively so as to provide the respective corresponding pseudo-random pulse series through the OR device 36.

As mentioned above, each of the random pulse series generating apparatuses 48-0 through 48-3 of which a large number are provided in the neural network system, does not employ the ALU having the relatively large circuit scale. Thus, application of the random pulse series generating apparatuses each employing the primary random pulse series generating unit according to the present invention to such a neural network system can greatly reduce the entire circuit scale of the neural network system to a scale much smaller than that of the neural network system of the related art which employs the ALU as calculating means for processing the input signals x1, x2, . . .

The random pulse density determination data which is stored in the up/down counter 46 comprises four-bit data in the above description. Thus, the number of the AND devices 43, 43, 41, and 44 provided is four accordingly. However, such bit number may be predetermined to be any number as desired.

Figure 13:
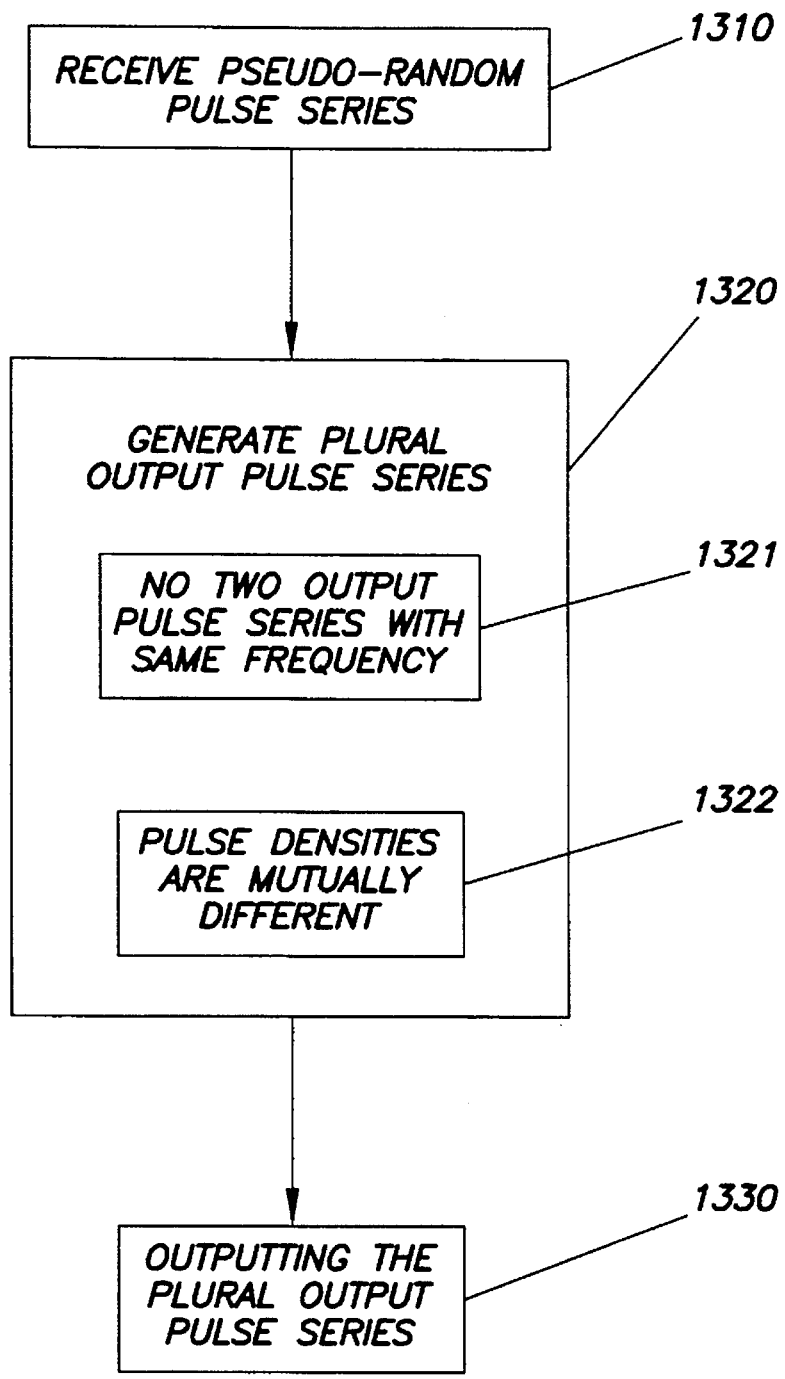
FIG. 13 is a flow chart illustrating a method of generating a plurality of output pulse series, in accordance with the principles of the present invention.

In accordance with the teachings of the present invention, a method of generating a plurality of output pulse series is also provided. A flow chart illustrating the inventive method is shown in FIG. 13. The method includes the following steps.

A first step 1310 involves receiving a plurality of pseudo-random pulse series in parallel with each other.

A second step 1320 is operating on the plurality of pseudo-random pulse series received in the receiving step, so as to generate a plurality of output pulse series. The operating step constitutes the following:

First, at 1321, the plurality of generated output pulse series have mutually different respective probabilities of generation, so that no two output pulse series will probabilistically be generated with the same frequency. Second, at 1322, the plurality of generated output pulse series constitute a first output pulse series through an n-th output pulse series having a respective first number of pulses through an n-th number of pulses during a predetermined time period, so that the plurality of output pulse series are described by a respective first pulse density through an n-th pulse density. Accordingly, each of the first number through n-th number is different from all other numbers of the first number through the n-th number, so that the first pulse density through the n-th pulse density are mutually different.

A third step 1330 involves outputting, in parallel with each other, the plurality of output pulse series generated in the operating step 1320.

The present invention is not limited to the above described embodiments, and variations and modifications may be made without departing from the scope of the present invention.

What is claimed is:

1. A multiple pulse series generating apparatus, comprising:
   a) receiving means for receiving a plurality of input pulse series of arbitrary shape, each input pulse series having an arbitrary number of pulses;
   b) pulse series converting means, responsive to the receiving means, for converting the plurality of input pulse series into a plurality of output pulse series, wherein the arbitrary number of pulses in the input pulse series and pulses of the plurality of output pulse series are at a first level or a second level, and wherein the pulse series converting means includes:
1) first arranging means for arranging the plurality of input pulse series into a first arbitrary sequence of input pulse series, the first arbitrary sequence including:
   (1) a first input pulse series; and
   (2) a later input pulse series other than the first input pulse series; and
2) second arranging means for arranging the first arbitrary sequence of input pulse series into a second sequence of output pulse series as the plurality of output pulse series, wherein:
   2A) the second sequence of output pulse series includes:
      (1) a first output pulse series; and
      (2) a later output pulse series other than the first output pulse series; and
   2B) the second arranging means includes:
      aa) means for determining the first output pulse series in the second sequence as being the first input pulse series in the first sequence;
      bb) means for determining that a pulse of the later output pulse series in the second sequence has the first level only when both:
         i) a corresponding pulse in the later input pulse series is at the first level; and
         ii) a corresponding pulse in the first input pulse series is at the second level; and
      cc) means for determining the second sequence of output pulse series as constituting a first output pulse series through an n-th output pulse series having a respective first number of pulses through an n-th number of pulses during a predetermined time period so that the plurality of output pulse series are described by a respective first pulse density through an n-th pulse density, wherein each of the first number through the n-th number is different from all other numbers of the first number through the n-th number so that the first pulse density through the n-th pulse density are mutually different; and
c) output means, responsive to the pulse series converting means, for outputting the plurality of output pulse series.

2. A multiple pulse series generating apparatus, comprising:
a) receiving means for receiving a plurality of input pulse series of arbitrary shape, each input pulse series having an arbitrary number of pulses;
b) pulse series converting means, responsive to the receiving means, for converting the plurality of input pulse series into a plurality of output pulse series, wherein the arbitrary number of pulses in the input pulse series and pulses of the plurality of output pulse series are at a first level or a second level, and wherein the pulse series converting means includes:
1) first arranging means for arranging the plurality of input pulse series into a first arbitrary sequence of input pulse series, the first arbitrary sequence including:
   (1) a first input pulse series;
   (2) a later input pulse series other than the first input pulse series; and
   (3) at least one intervening input pulse series interposed in the first sequence between the first input pulse series and the later input pulse series; and
2) second arranging means for arranging the first arbitrary sequence of input pulse series into a second sequence of output pulse series as the plurality of output pulse series, wherein:
   2A) the second sequence of output pulse series includes:
      (1) a first output pulse series; and
      (2) a later output pulse series other than the first output pulse series; and
   2B) the second arranging means includes:
      aa) means for determining the first output pulse series in the second sequence as being the first input pulse series in the first sequence;
      bb) means for determining that a pulse of the later output pulse series in the second sequence has the first level only when both:
         i) a corresponding pulse in the later input pulse series is at the first level; and
         ii) corresponding pulses in the first input pulse series and in the intervening input pulse series are at the second level; and
      cc) means for determining the second sequence of output pulse series as constituting a first output pulse series through an n-th output pulse series having a respective first number of pulses through an n-th number of pulses during a predetermined time period so that the plurality of output pulse series are described by a respective first pulse density through an n-th pulse density, wherein each of the first number through the n-th number is different from all other numbers of the first number through the n-th number so that the first pulse density through the n-th pulse density are mutually different; and
c) output means, responsive to the pulse series converting means, for outputting the plurality of output pulse series.

* * * * *